United States Patent
Bjelopavlic et al.

(10) Patent No.: US 11,124,704 B2
(45) Date of Patent: *Sep. 21, 2021

(54) ETCHING COMPOSITIONS

(71) Applicant: Fujifilm Electronic Materials U.S.A., Inc., N. Kingstown, RI (US)

(72) Inventors: Mick Bjelopavlic, Chandler, AZ (US); Carl Ballesteros, San Tan Valley, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/159,551

(22) Filed: Jan. 27, 2021

(65) Prior Publication Data

US 2021/0214612 A1 Jul. 15, 2021

Related U.S. Application Data

(63) Continuation of application No. 16/517,720, filed on Jul. 22, 2019, now Pat. No. 10,920,144.

(60) Provisional application No. 62/811,600, filed on Feb. 28, 2019, provisional application No. 62/774,382, filed on Dec. 3, 2018.

(51) Int. Cl.
*C09K 13/10* (2006.01)
*H01L 21/306* (2006.01)
*C09K 13/08* (2006.01)

(52) U.S. Cl.
CPC .............. *C09K 13/10* (2013.01); *C09K 13/08* (2013.01); *H01L 21/30604* (2013.01)

(58) Field of Classification Search
None
See application file for complete search history.

(56) References Cited

U.S. PATENT DOCUMENTS

| | | |
|---|---|---|
| 4,604,404 A | 8/1986 | Munson, Jr. et al. |
| 5,705,089 A | 1/1998 | Sugihara et al. |
| 7,452,481 B2 | 11/2008 | Suzuki et al. |
| 2003/0077985 A1 | 4/2003 | Zhou et al. |
| 2003/0158059 A1 | 8/2003 | Sakai et al. |
| 2007/0111474 A1 | 5/2007 | Delattre et al. |
| 2008/0045016 A1 | 2/2008 | Andou et al. |
| 2008/0076327 A1 | 3/2008 | Yamaguchi et al. |
| 2008/0173328 A1 | 7/2008 | Nishiwaki |
| 2008/0214401 A1 | 9/2008 | Alexander |
| 2008/0254315 A1 | 10/2008 | Sato et al. |
| 2010/0112728 A1 | 5/2010 | Korzenski et al. |
| 2013/0072615 A1 | 3/2013 | Muro et al. |
| 2014/0186996 A1 | 7/2014 | Takeuchi et al. |
| 2015/0279654 A1 | 10/2015 | Kato et al. |
| 2016/0047053 A1 | 2/2016 | Sugishima et al. |
| 2016/0053385 A1 | 2/2016 | Muro et al. |
| 2016/0056054 A1 | 2/2016 | Takahashi et al. |
| 2016/0118264 A1 | 4/2016 | Kamimura et al. |
| 2020/0006414 A1 | 1/2020 | Hamada |
| 2020/0172808 A1 | 6/2020 | Bjelopavlic et al. |

OTHER PUBLICATIONS

International Search Report and Written Opinion of the International Searching Authority for International Application No. PCT/US19/42780 dated Oct. 9, 2019.
Arduini et al., "Synthesis and structural characterization of region-controlled oligomers from 2-naphthalensulfonic acid and formaldehyde", Tetrahedron, vol. 46, No. 10, pp. 3613-3620 (1990).

*Primary Examiner* — Allan W. Olsen
(74) *Attorney, Agent, or Firm* — Fish & Richardson P.C.

(57) ABSTRACT

The present disclosure is directed to etching compositions that are useful for, e.g., selectively removing silicon germanium (SiGe) from a semiconductor substrate as an intermediate step in a multistep semiconductor manufacturing process.

10 Claims, No Drawings

ETCHING COMPOSITIONS

CROSS-REFERENCE TO RELATED APPLICATIONS

The present application is a continuation of and claims priority under 35 U.S.C. § 120 to U.S. application Ser. No. 16/517,720, filed on Jul. 22, 2019, which claims priority to U.S. Provisional Application Ser. No. 62/811,600, filed on Feb. 28, 2019 and U.S. Provisional Application Ser. No. 62/774,382, filed on Dec. 3, 2018. The contents of each of these priority applications are hereby incorporated by reference in their entirety.

FIELD OF THE DISCLOSURE

The present disclosure relates to etching compositions and processes of using etching compositions. In particular, the present disclosure relates to etching compositions that can selectively etch silicon germanium in the presence of other exposed or underlying materials, such as metal conductors (e.g., copper), barrier materials, insulator materials (e.g., low-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Silicon germanium (SiGe) can be utilized in the manufacturing of semiconductor devices, liquid crystal displays, MEMS (Micro Electro Mechanical Systems), printed wiring boards and the like, as nanowires and/or nanosheets. For example, it can be used as a gate material in a multigate device, such as a multiple-gate field-effect transistor (FET) (e.g., a gate-all-around FET).

SUMMARY OF THE DISCLOSURE

In the construction of semiconductor devices, silicon germanium (SiGe) frequently needs to be etched. In the various types of uses and device environments of SiGe, other layers are in contact with or otherwise exposed at the same time as this material is etched. Highly selective etching of the SiGe in the presence of these other materials (e.g. metal conductors, dielectric, and hard masks) is typically needed for device yield and long life. The etching process for the SiGe may be a plasma etching process. However, using a plasma etching process on the SiGe layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at a significant cost.

The present disclosure relates to compositions and processes for selectively etching SiGe relative to hard mask layers, gate materials (e.g., SiN, poly-Si, or SiOx) and low-k dielectric layers (e.g., SiN, poly-Si, SiOx, carbon doped oxide, or SiCO) that are present in the semiconductor device. More specifically, the present disclosure relates to compositions and processes for selectively etching SiGe relative to low-k dielectric layers.

In one aspect, the disclosure features an etching composition that includes a) at least one fluorine-containing acid, the at least one fluorine-containing acid including hydrofluoric acid or hexafluorosilicic acid; b) at least one oxidizing agent; c) at least one organic acid or an anhydride thereof, the at least one organic acid including formic acid, acetic acid, propionic acid, or butyric acid; d) at least one polymerized naphthalene sulfonic acid; e) at least one amine, the at least one amine including an amine of formula (I): N—$R_1R_2R_3$, in which $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally in substituted by OH; and f) water.

In another aspect, the disclosure features a method that includes contacting a semiconductor substrate containing a SiGe film with an etching composition described herein to remove the SiGe film.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

In general, the disclosure features an etching composition (e.g., an etching composition for selectively removing SiGe) that includes a) at least one fluorine-containing acid, the at least one fluorine-containing acid including hydrofluoric acid (HF) or hexafluorosilicic acid ($H_2SiF_6$); b) at least one oxidizing agent, the at least one oxidizing agent including hydrogen peroxide; c) at least one organic acid, the at least one organic acid including formic acid, acetic acid, propionic acid, or butyric acid; d) at least one polymerized naphthalene sulfonic acid; e) at least one amine, the at least one amine including an amine of formula (I): N—$R_1R_2R_3$, in which $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and f) water.

In general, the etching composition of this disclosure can include at least one (e.g., two, three, or four) fluorine-containing agent. The fluorine-containing acid described herein can be an inorganic acid, such as HF or $H_2SiF_6$. In some embodiments, the at least one fluorine-containing acid is in an amount of at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 1.2 wt %, at least about 1.4 wt %, or at least about 1.5 wt %) to at most about 2 wt % (e.g., at most about 1.9 wt %, at most about 1.8 wt %, at most about 1.7 wt %, at most about 1.6 wt %, at most about 1.5 wt %, at most about 1.2 wt %, at most about 1 wt %, or at most about 0.5 wt %) of the etching composition of this disclosure. Without wishing to be bound by theory, it is believed that fluorine-containing acid can facilitate and enhance the removal of SiGe on a semiconductor substrate during the etching process.

The etching composition of this disclosure can include at least one (e.g., two, three, or four) oxidizing agent suitable for use in microelectronic applications. Examples of suitable oxidizing agents include, but are not limited to, oxidizing acids or salts thereof (e.g., nitric acid, permanganic acid, or potassium permanganate), peroxides (e.g., hydrogen peroxide, dialkylperoxides, urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, peroxycarboxylic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate, sodium perchlorate, or tetramethylammonium perchlorate)), and periodic acid and salts thereof (e.g., periodic acid, ammonium periodate, or tetramethylammonium periodate). These oxidizing agents can be used singly or in combination.

In some embodiments, the at least one oxidizing agent can be from at least about 5% by weight (e.g., at least about 6% by weight, at least about 7% by weight, at least about 8% by weight, at least about 9% by weight, at least about 10% by weight, at least about 11% by weight, at least about 13% by weight, or at least about 15% by weight) to at most about 20% by weight (e.g., at most about 18 wt %, at most about 16 wt %, at most about 15 wt %, at most about 14 wt %, at most about 12 wt %, or at most 3.0 about 10 wt %) of the etching composition of this disclosure. Without wishing to be bound by theory, it is believed that the oxidizing agent can facilitate and enhance the removal of SiGe on a semiconductor substrate.

In general, the etching composition of this disclosure can include at least one (e.g., two, three, or four) organic acid or an anhydride thereof. In some embodiments, the organic acid can be formic acid, acetic acid, propionic acid, or butyric acid. In some embodiments, the organic acid anhydride can be formic anhydride, acetic anhydride, propionic anhydride, or butyric anhydride. In some embodiments, the at least one organic acid or an anhydride thereof can be from at least about 30% by weight (e.g., at least about 35% by weight, at least about 40% by weight, at least about 45% by weight, at least about 50% by weight, at least about 55% by weight, or at least about 60% by weight) to at most about 90% by weight (e.g., at most about 85 wt %, at most about 80 wt %, at most about 75 wt %, at most about 70 wt %, at most about 65 wt %, at most about 60 wt %, at most about 55 wt %, at most about 50 wt %, at most about 45 wt %, or at most about 40 wt %) of the etching composition of this disclosure. Without wishing to be bound by theory, it is believed that the organic acid or an anhydride thereof can facilitate and enhance the removal of SiGe on a semiconductor substrate.

The etching composition of this disclosure can generally include at least one polymerized naphthalene sulfonic acid (or poly(naphthalene sulfonic acid)), e.g., as a surfactant or selective inhibitor. In some embodiments, the polymerized naphthalene sulfonic acid can be a sulfonic acid having the following chemical structure:

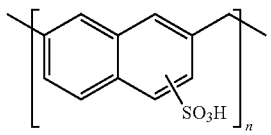

in which n is 3, 4, 5, or 6. Commercially available examples of such the polymerized naphthalene sulfonic acids include Takesurf A-47 series products available from Takemoto Oil & Fat Co., Ltd. In some embodiments, the at least one polymerized naphthalene sulfonic acid can be from at least about 0.005% by weight (e.g., at least about 0.01% by weight, at least about 0.02% by weight, at least about 0.03% by weight, at least about 0.04% by weight, at least about 0.05% by weight, or at least about 0.1% by weight) to at most about 0.15% by weight (e.g., at most about 0.14 wt %, at most about 0.12 wt %, at most about 0.1 wt %, at most about 0.08 wt %, at most about 0.06 wt %, or at most about 0.05 wt %) of the etching composition of this disclosure. Without wishing to be bound by theory, it is believed that the polymerized naphthalene sulfonic acid can selectively inhibit the removal of SiN, poly-Si, and SiCO when SiGe is removed from a semiconductor substrate using the etching composition of this disclosure.

In general, the etching composition of this disclosure can include at least one (e.g., two, three, or four) amine. In some embodiments, the amine can be an amine of formula (I): $N—R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH. Examples of suitable amines of formula (I) include diisopropylamine, N-butyldiethanolamine, N-(3-aminopropyl)-diethanolamine, N-octylglucamine, N-ethylglucamine, N-methylglucamine, and 1-[bis(2-hydroxyethyl)amino]-2-propanol.

In some embodiments, the at least one amine can be from at least about 0.001% by weight (e.g., at least about 0.002% by weight, at least about 0.005% by weight, at least about 0.008% by weight, at least about 0.01% by weight, at least about 0.02% by weight, at least about 0.05% by weight, or at least about 0.1% by weight) to at most about 0.15% by weight (e.g., at most about 0.14 wt %, at most about 0.12 wt %, at most about 0.1 wt %, at most about 0.08 wt %, at most about 0.06 wt %, or at most about 0.05 wt %) of the etching composition of this disclosure. Without wishing to be bound by theory, it is believed that the amine can selectively inhibit the removal of SiN, poly-Si, and SiCO when SiGe is removed from a semiconductor substrate using the etching composition of this disclosure.

In general, the etching composition of this disclosure can include water as a solvent. In some embodiments, the water can be de-ionized and ultra-pure, contain no organic contaminants and have a minimum resistivity of about 4 to about 17 mega Ohms, or at least about 17 mega Ohms. In some embodiments, the water is in an amount of from at least about 20 wt % (e.g., at least about 25% by weight, at least about 30% by weight, at least about 35% by weight, at least about 40% by weight, at least about 45% by weight, at least about 50% by weight, at least about 55% by weight, or at least about 60% by weight) to at most about 75 wt % (e.g., at most about 70 wt %, at most about 65 wt %, at most about 60 wt %, at most about 55 wt %, at most about 50 wt %, at most about 45 wt %, or at most about 40 wt %) of the etching composition. Without wishing to be bound by theory, it is believed that, if the amount of water is greater than 75 wt % of the composition, it would adversely impact the SiGe etch rate, and reduce its removal during the etching process. On the other hand, without wishing to be bound by theory, it is believed that the etching composition of this disclosure should include a certain level of water (e.g., at least about 20 wt %) to keep all other components solubilized and to avoid reduction in the etching performance.

In some embodiments, the etching composition of this disclosure can further include at least one (e.g., two, three, or four) organic solvent. In some embodiments, the at least one organic solvent can include an alcohol or an alkylene glycol ether. Examples of suitable organic solvents include propylene glycol, hexylene glycol, 1,3-propanediol, ethylene glycol butyl ether, and 3-methoxy-3-methyl-1-butanol. In some embodiments, the at least one organic solvent can be from at least about 10 wt % (e.g., at least about 15% by weight, at least about 20% by weight, at least about 25% by weight, at least about 30% by weight, or at least about 35% by weight) to at most about 40 wt % (e.g., at most about 35 wt %, at most about 30 wt %, at most about 25 wt %, at most about 20 wt %, or at most about 15 wt %) of the etching composition.

In some embodiments, the etching composition of this disclosure can further include at least one (e.g., two, three, or four) sugar alcohol (e.g., mannitol or sorbitol). In some embodiments, the at least one sugar alcohol can be from at least about 0.001 wt % (e.g., at least about 0.002% by weight, at least about 0.005% by weight, at least 3.0 about 0.01% by weight, at least about 0.02% by weight, or at least about 0.05% by weight) to at most about 0.1 wt % (e.g., at most about 0.08 wt %, at most about 0.06 wt %, at most about 0.05 wt %, at most about 0.04 wt %, at most about 0.02 wt %, or at most about 0.01 wt %) of the etching composition. Without wishing to be bound by theory, it is believed that including a sugar alcohol in the etching composition of this disclosure can inhibit the polysilicon etch rate.

In some embodiments, the etching composition of this disclosure can further include at least one (e.g., two, three, or four) boronic acid. For example, the boronic acid can be of the following formula: R—B(OH)$_2$, in which R is $C_1$-$C_{10}$ alkyl, aryl, or heteroaryl where aryl or heteroaryl can be optionally substituted by one to six (e.g., 1, 2, 3, 4, 5, or 6) $C_1$-$C_{10}$ alkyl. Examples of suitable boronic acids include phenyl boronic acid and naphthalene-1-boronic acid.

In some embodiments, the at least one boronic acid can be from at least about 0.01 wt % (e.g., at least about 0.02% by weight, at least about 0.05% by weight, at least about 0.1% by weight, at least about 0.2% by weight, or at least about 0.3% by weight) to at most about 0.5 wt % (e.g., at most about 0.4 wt %, at most about 0.3 wt %, at most about 0.2 wt %, at most about 0.1 wt %, at most about 0.08 wt %, or at most about 0.05 wt %) of the etching composition. Without wishing to be bound by theory, it is believed that including a boronic in the etching composition of this disclosure can inhibit the SiOx etch rate.

In some embodiments, the etching composition of this disclosure can have a pH of at least about 1 (e.g., at least about 1.2, at least about 1.4, at least about 1.5, at least about 1.6, at least about 1.8, at least about 2, at least about 2.2, at least about 2.4, or at least about 2.5) and/or at most about 3 (e.g., at most about 2.8, at most about 2.6, at most about 2.5, at most about 2.4, at most about 2.2, at most about 2, or at most about 1.5). Without wishing to be bound by theory, it is believed that an etching composition having a pH higher than 3 would not have sufficient SiGe selectivity relative to low-k dielectric materials (e.g., SiOx) as such an etching composition may have a significantly increased low-k dielectric material etch rate. Further, it is believed that an etching composition having a pH lower than 1 could decompose certain components in the composition due to strong acidity.

In addition, in some embodiments, the etching composition of the present disclosure may contain additives such as, pH adjusting agents, corrosion inhibitors, surfactants, additional organic solvents, biocides, and defoaming agents as optional components. Examples of suitable additives include alcohols (e.g., polyvinyl alcohol), organic acids (e.g., iminidiacetic acid, malonic acid, oxalic acid, succinic acid, and malic acid), and inorganic acids (e.g., boric acid). Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants may be cationic, anionic, nonionic or amphoteric.

In general, the etching composition of the present disclosure can have a relatively high SiGe/dielectric material (e.g., SiN, polysilicon, or SiCO) etch selectivity (i.e., a high ratio of SiGe etch rate over dielectric material etch rate). In some embodiments, the etching composition can have a SiGe/dielectric material etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching compositions of the present disclosure may specifically exclude one or more of the additive components, in any combination, if more than one. Such components are selected from the group consisting of polymers, oxygen scavengers, quaternary ammonium salts (including quaternary ammonium hydroxides such as TMAH), amines, alkaline bases (such as NaOH, KOH, and LiOH), surfactants other than a defoamer, a defoamer, fluoride containing compounds, abrasives, silicates, hydroxycarboxylic acids containing more than two hydroxyl groups, carboxylic and polycarboxylic acids lacking amino groups, silanes (e.g., alkoxysilanes), cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), buffering agents, non-azole corrosion inhibitors, and metal salts (e.g., metal halides).

The etching composition of this disclosure can be prepared by simply mixing the components together, or may be prepared by blending two compositions in a kit. The first composition in the kit can be an aqueous solution of an oxidizing agent (e.g., $H_2O_2$). The second composition in the kit can contain the remaining components of the etching composition of this disclosure at predetermined ratios in a concentrated form such that the blending of the two compositions will yield a desired etching composition of the disclosure.

In some embodiments, the present disclosure features a method of etching a semiconductor substrate containing at least one SiGe film. The method can include contacting a semiconductor substrate containing the at least one SiGe film with an etching composition of this disclosure to remove the SiGe film. The method can further include rinsing the semiconductor substrate with a rinse solvent after the contacting step and/or drying the semiconductor substrate after the rinsing step. In some embodiments, the method does not substantially remove a metal conductor (e.g., Cu) or a dielectric material (e.g., SiN, polysilicon, or SiCO) in the semiconductor substrate. For example, the method does not remove more than about 5% by weight (e.g., more than about 3% by weight or more than about 1% by weight) of a metal conductor or a dielectric material in the semiconductor substrate.

In some embodiments, the SiGe film in a semiconductor substrate can include at least about 10 wt % (e.g., at least about 12 wt %, at least about 14 wt %, at least about 15 wt %, at least about 16 wt %, at least about 18 wt %, or at least about 20 wt %) and/or at most about 35 wt % (e.g., at most about 34 wt %, at most about 32 wt %, at most about 30 wt %, at most about 28 wt %, at most about 26 wt %, at most about 25 wt %, at most about 24 wt %, at most about 22 wt %, at most about 20 wt %, at most about 18 wt %, at most about 16 wt %, or at most about 15 wt %) Ge in the SiGe film. Without wishing to be bound by theory, it is believed that a SiGe film containing from about 10 wt % to about 35 wt % Ge can be more easily removed from a semiconductor substrate by an etching composition compared to a film containing more than 35 wt % or less than 10 wt % Ge.

In some embodiments, the etching method includes the steps of:

(A) providing a semiconductor substrate containing a SiGe film;

(B) contacting the semiconductor substrate with an etching composition described herein;

(C) rinsing the semiconductor substrate with one or more suitable rinse solvents; and (D) optionally, drying the semiconductor substrate (e.g., by any suitable means that removes the rinse solvent and does not compromise the integrity of the semiconductor substrate).

The semiconductor substrates containing SiGe to be etched in this method can contain organic and organometallic residues, and a range of metal oxides, some or all of which may also be removed during the etching process.

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, polysilicon, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 20° C. to about 80° C., from about 55° C. to about 65° C., or from about 60° C. to about 65° C.). The etch rates of SiGe increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 300 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket film etch rate measurements on films were carried out using commercially available unpatterned 300 mm diameter wafers that were diced into 0.5"×1.0" test coupons for evaluation. Primary blanket film materials used for testing include 1) a SiGe film of about 500 Å thickness deposited on a silicon substrate; 2) a SiNx film of about 600 Å thickness deposited on a silicon substrate, 3) a polysilicon film of about 1000 Å thickness deposited on a silicon substrate; 4) a SiCO film of about 200 Å thickness deposited on a silicon substrate, and 5) a SiOx film of about 1200 Å thickness deposited on a silicon substrate.

The blanket film test coupons were measured for pre-treatment and post-treatment thickness to determine blanket film etch rates. For the SiGe, SiNx, SiOx, and polysilicon blanket films, the film thicknesses were measured pre-treatment and post-treatment by Ellipsometry using a Woollam VASE.

Patterned test coupons SiGe (3 nm)/Si were evaluated for materials compatibility and/or etching responses. The post-treatment test coupons were then subjected to evaluation by scanning electron microscopy (SEM). The SEM images from the post treatment coupon were compared to a previously taken pre-treatment SEM image set to evaluate materials compatibility and etching response of each test formulation with the patterned test device features.

General Procedure 3

Etching Evaluation with Beaker Test

All blanket film etch testing was carried out at room temperature (21-23° C.) in a 600 mL glass beaker containing 200 g of a sample solution with continuous stirring at 250 rpm, with the Parafilm® cover in place at all times to minimize evaporative losses. All blanket test coupons having a blanket dielectric film exposed on one side to the sample solution were diced by diamond scribe into 0.5"×1.0" square test coupon size for beaker scale testing. Each individual test coupon was held into position using a single 4" long, locking plastic tweezers clip. The test coupon, held on one edge by the locking tweezers clip, was suspended into the 600 mL HDPE beaker and immersed into the 200 g test solution while the solution was stirred continuously at 250 rpm at room temperature. Immediately after each sample coupon was placed into the stirred solution, the top of the 600 mL HDPE beaker was covered and resealed with Parafilm®. The test coupons were held static in the stirred solution until the treatment time (as described in General Procedure 3A) had elapsed. After the treatment time in the test solution had elapsed, the sample coupons were immediately removed from the 600 mL HDPE beaker and rinsed according to General Procedure 3A. After the final IPA rinse step, all test coupons were subject to a filtered nitrogen gas blow off step using a hand held nitrogen gas blower which forcefully removed all traces of IPA to produce a final dry sample for test measurements.

General Procedure 3A (Blanket Test Coupons)

Immediately after a treatment time of 2 to 10 minutes according to General Procedure 3, the coupon was immersed in a 300 mL volume of ultra-high purity deionized (DI) water for 15 seconds with mild agitation, which was followed by 300 mL of isopropyl alcohol (IPA) for 15 seconds with mild agitation, and a final rinse in 300 mL of IPA for 15 seconds with mild agitation. The processing was completed according to General Procedure 3.

Example 1

Formulation Examples 1-8 (FE-1 to FE-8) were prepared according to General Procedure 1, and evaluated according to General Procedures 2 and 3A. The formulations and the test results are summarized in Table 1.

TABLE 1

| Composition [wt %] | FE-1 | FE-2 | FE-3 | FE-4 | FE-5 | FE-6 | FE-7 | FE-8 |
|---|---|---|---|---|---|---|---|---|
| Hydrofluoric acid | 0.3% | 0.3% | 0.3% | 0.3% | 0.3% | 0.3% | 0.3% | 0.3% |
| Hydrogen Peroxide | 8.5% | 8.5% | 8.5% | 8.5% | 8.5% | 8.5% | 8.5% | 8.5% |
| Acetic acid | 45% | 45% | 45% | 45% | 45% | 45% | 45% | 45% |
| Takesuri A-47Q | 0.01% | 0.01% | 0.01% | 0.01% | 0.01% | 0.01% | 0.01% | 0.005% |
| Amine | 0.01% | 0.01% | 0.01% | 0.01% | 0.01% | 0.01% | 0.01% | 0.005% |
|  | DIPA | BDEA | APDA | OGA | EGA | MGA | BHEAP | APDA |
| Water | 46.18% | 46.18% | 46.18% | 46.18% | 46.18% | 46.18% | 46.18% | 46.19% |
| Total | 100% | 100% | 100% | 100% | 100% | 100% | 100% | 100% |
| Test results | | | | | | | | |
| SiGe25 ER (Å/min) | 94.7 | 65.7 | 90 | N/A | 60.8 | 62.2 | 58.8 | 100 |
| SiNx ER (Å/min) | 2.5 | 2.7 | 0 | N/A | 2.2 | 1.6 | 1.9 | 0.5 |
| Poly-Si ER (Å/min) | 3.0 | 2.9 | 1.4 | N/A | 3.0 | 3.0 | 2.8 | 2.7 |

TABLE 1-continued

| Composition [wt %] | FE-1 | FE-2 | FE-3 | FE-4 | FE-5 | FE-6 | FE-7 | FE-8 |
|---|---|---|---|---|---|---|---|---|
| SiCO ER (Å/min) | 0.6 | 0.5 | 0.4 | N/A | 0.3 | 0.4 | 0.4 | 0.7 |
| SiOx ER (Å/min) | N/A | N/A | 34.08 | 104.31 | N/A | N/A | N/A | N/A |

DIPA = Diisopropylamine
BDEA = N-butyldiethanolamine
APDA = N-(3-aminopropyl)-diethanolamine
OGA = N-octylglucamine
EGA = N-ethylglucamine
MGA = N-methylglucamine
BHEAP = 1-[Bis(2-hydroxyethyl)amino]-2-propanol
SiGe25 = a SiGe film containing 25 wt % Ge
ER = etch rate
N/A = Not available As shown in Table 1, FE-1 to FE-3 and FE-5 to FE-8 (which include Takesurf A-47Q and various amines described herein) all exhibited relatively high SiGe25/SiNx, SiGe25/poly-Si, and SiGe25/SiCO etch selectivity. In other words, these formulations could effectively remove the SiGe film while minimizing the removal of exposed SiNx, poly-Si, and SiCO on a semiconductor substrate during the etching process. Although some of these formulations exhibited relatively high SiOx etch rate, a low SiOx etch rate or a high SiGe25/SiOx etch selectivity (although preferred) are only a part of the objectives of the etching formulations of the present disclosure. The etching formulations of the present disclosure can still be satisfactory for theft intended purposes even if they exhibit a relatively high SiOx etch rate.

Comparative Formulation Examples 1-5 (CFE-1 to CFE-5) were prepared according to General Procedure 1, and evaluated according to General Procedures 2 and 3A. The formulations and the test results are summarized in Table 2.

A-47Q was replaced by another sulfonic acid. The results show again that this formulation exhibited a relatively high poly-Si etch rate. CFE-4 contained Takesurf A-47Q, contained no amine, and contained an additive (i.e., PVP). The results showed that, although this formulation exhibited a relatively low poly-Si etch rate, its SiGe etch rate was reduced. CFE-5 was identical to CFE-4 except that Takesurf A-47Q was replaced by another sulfonic acid. The results show again that this formulation again exhibited a relatively low SiGe etch rate. CFE-6 and CFE-7 were identical to CFE-1 except that an amine of formula (I) described herein was added into these two formulations. Similar to CFE-1, the results show that these two formulations exhibited relatively high SiNx etch rates. CFE-8 contained no HF, no Takesurf A-47Q, and no amine. The results showed that it did not etch SiGe at all, which is a target material to be removed by the etching compositions described in the present disclosure.

TABLE 2

| Composition [wt %] | CFE-1 | CFE-2 | CFE-3 | CFE-4 | CFE-5 | CFE-6 | CFE-7 | CFE-8 |
|---|---|---|---|---|---|---|---|---|
| Hydrofluoric acid | 0.5% | 0.5% | 0.3% | 0.3% | 0.3% | 0.3% | 0.3% | 0% |
| Hydrogen Peroxide | 8.5% | 8.5% | 8.5% | 8.5% | 8.5% | 8.5% | 8.5% | 8.5% |
| Acetic acid | 45% | 45% | 45% | 45% | 45% | 45% | 45% | 45% |
| Surfactant | None | 0.01% Takesurf A-47Q | 0.01% PSSA | 0.01% Takesurf A-47Q | 0.01% PSSA | None | None | None |
| Amine | None | None | None | None | None | None | None | None |
| Additive | None | None | None | 0.005% PVP | 0.005% PVP | 0.002% APDA | 0.01% APDA | 0.3% HFA |
| Water | 46% | 45.99% | 46.19% | 46.185% | 46.185% | 46.198% | 46.19% | 46.18% |
| Total | 100% | 100% | 100% | 100% | 100% | 100% | 100% | 100% |
| Test results | | | | | | | | |
| SiGe25 ER (Å/min) | 142.5 | 143.3 | 140.5 | 53.7 | 50.9 | 95.9 | 106.3 | 0 |
| SiNx ER (Å/min) | 7.4 | 2.5 | 2.5 | 0.8 | 1.6 | 5.4 | 6 | 0 |
| Poly-Si ER (Å/min) | N/A | 5.8 | 5.6 | 2.4 | 2.8 | 4 | 1.4 | 0.1 |
| SiCO ER (Å/min) | N/A | 0.3 | 0.4 | 1.1 | 0 | 0.6 | 0.5 | 0.7 |
| SiOx ER (Å/min) | N/A | N/A | N/A | N/A | N/A | N/A | N/A | 1.5 |

PSSA = Poly (4-styrene sulfonic acid)
PVP = Polyvinylpyrrolidone
HFA = Hexfluorosilicic acid As shown in Table 2, CFE-1 contained no Takesurf A-47Q or amine. As a result, it exhibited a relatively high SiNx etch rate. CFE-2 contained Takesurf A-47Q but contained no amine. The results showed that this formulation exhibited a much lower SiNx etch rate but a relatively high poly-Si etch rate. CFE-3 was identical to CFE-2 except that Takesurf Example 2

Formulation Examples 9 and 10 (FE-9 and FE-10) were prepared according to General Procedure 1, and evaluated according to General Procedures 2 and 3A. The formulations and the test results are summarized in Table 3.

TABLE 3

| Composition [wt %] | FE-9 | FE-10 |
|---|---|---|
| Hydrofluoric acid | 0.3% | 0.3% |
| Hydrogen Peroxide | 8.5% | 8.5% |
| Acetic acid | 45% | 45% |
| Takesurf A-47Q | 0.01% | 0.01% |
| APDA | 0.01% | 0.01% |
| Additive | 0.01% | 0.01% |
|  | D-Mannitol | D-Sorbitol |
| Water | 46.17% | 46.17% |
| Total | 100% | 100% |
| Test results | | |
| SiGe25 ER (Å/min) | 96.4 | 97.8 |
| SiNx ER (Å/min) | 0 | 0 |
| Poly-Si ER (Å/min) | 1.8 | 1.8 |
| SiCO ER (Å/min) | 0.9 | 0.9 |
| SiOx ER (Å/min) | 36.8 | 35.0 |

As shown in Table 3, FE-9 and FE-10 included an additive (i.e., a sugar alcohol) in their formulations. The results show that both formulations exhibited excellent SiGe25/SiNx, SiGe25/poly-Si, and SiGw25/SiCO etch selectivity.

Example 3

Formulation Examples 11-15 (FE-11 to FE-15) were prepared according to General Procedure 1, and evaluated according to General Procedures 2 and 3A. The formulations the test results are summarized in Table 4.

TABLE 4

| Composition [wt %] | FE-11 | FE-12 | FE-13 | FE-14 | FE-15 |
|---|---|---|---|---|---|
| Hydrofluoric acid | 0.27% | 0.24% | 0.21% | 0.18% | 0.15% |
| Hydrogen Peroxide | 7.65% | 6.8% | 5.95% | 5.1% | 4.25% |
| Acetic acid | 40.5% | 36% | 31.5% | 27% | 22.5% |
| Takesurf A-47Q | 0.01% | 0.01% | 0.01% | 0.01% | 0.01% |
| APDA | 0.01% | 0.01% | 0.01% | 0.01% | 0.01% |
| Water | 51.56% | 56.94% | 62.32% | 67.7% | 73.8% |
| Total | 100% | 100% | 100% | 100% | 100% |
| Test results | | | | | |
| SiGe25 ER (Å/min) | 115.8 | 103.2 | 82.5 | 68.6 | 48 |
| SiNx ER (Å/min) | 0 | 0 | 0 | 0 | 0 |
| Poly-Si ER (Å/min) | 2.4 | 2.1 | 1.9 | 1.9 | 1.5 |
| SiCO ER (Å/min) | 0.4 | 0.3 | 0.3 | 0.3 | 0.4 |
| SiOx ER (Å/min) | 36.58 | 32.97 | 28.8 | 23.32 | 18.57 |

As shown in Table 4, FE-11 to FE-15 contained an increasing percentage of water and decreasing percentages of HF, $H_2O_2$, and HAc. These results show that, as the percentage of water increased, the SiGe25 etch rate decreased, while the SiOx etch rate also decreased. In other words, these data suggest that water can inhibit SiGe and SiOx etch rates during the etching process.

Example 4

Formulation Examples 16-21 (FE-16 to FE-21) were prepared according to General Procedure 1, and evaluated according to General Procedures 2 and 3A. The formulations and the test results are summarized in Table 5.

TABLE 5

| Composition [wt %] | FE-16 | FE-17 | FE-18 | FE-19 | FE-20 | FE-21 |
|---|---|---|---|---|---|---|
| Hydrofluoric acid | 0.3% | 0.3% | 0.3% | 0.3% | 0.3% | 0.3% |
| Hydrogen peroxide | 8.5% | 8.5% | 8.5% | 8.5% | 8.5% | 8.5% |
| Acetic acid | 69.91% | 45% | 45% | 45% | 45% | 45% |
| Takesurf A-47Q | 0.01% | 0.01% | 0.01% | 0.01% | 0.01% | 0.01% |
| APDA | 0.01% | 0.01% | 0.01% | 0.01% | 0.01% | 0.01% |
| Organic solvent | None | 24.91% PG | 24.91% HG | 24.91% EGBE | 24.91% MMB | 24.91% PD |
| Water | 21.27% | 21.27% | 21.27% | 21.27% | 21.27% | 21.27% |
| Total | 100% | 100% | 100% | 100% | 100% | 100% |
| Test results | | | | | | |
| SiGe25 ER (Å/min) | 125.3 | 86.0 | 91.9 | 92.1 | 92.6 | 92.1 |
| SiNx ER (Å/min) | 0 | 0 | 0 | 0.4 | 1.5 | 0 |
| Poly-Si ER (Å/min) | 2.3 | 2.4 | 2.7 | 2.9 | 2.0 | 2.9 |
| SiCO ER (Å/min) | 0.8 | 0.7 | 1.6 | 4.7 | 0.76 | 0.9 |
| SiOx ER (Å/min) | 27.8 | 16.1 | 22.7 | 27.7 | 18.6 | 18.0 |

PG = Propylene glycol
HG = Hexylene glycol
EGBE = Ethylene glycol butyl ether
MMB = 3-Methoxy-3-methyl-1-butanol
PD = 1,3-Propenediol As shown in Table 5, FE-16 contained no organic solvent, and FE-17 to FE-21 contained different water soluble organic solvents. The results showed that formulations FE-16 to FE-19 and FE-21 exhibited relatively high SiGe25/SiNx, SiGe25/poly-Si, and SiGe25/SiCO etch selectivity. The relevant data for formulation FE-20 were not measured. In addition, without wishing to be bound by theory, it is believed that propylene glycol, hexylene glycol, 3-methoxy-3-methyl-1-butanol, and 1,3-propanediol can inhibit the SiOx etch rate.

Example 5

Formulation Examples 22-31 (FE-22 to FE-31) were prepared according to General Procedure 1, and evaluated according to General Procedures 2 and 3A. The formulations and the test results are summarized in Table 6.

TABLE 6

| Composition [wt %] | FE-22 | FE-23 | FE-24 | FE-25 | FE-26 | FE-27 | FE-28 | FE-29 | FE-30 | FE-31 |
|---|---|---|---|---|---|---|---|---|---|---|
| Hydrofluoric acid | 0.3% | 0.3% | 0.3% | 0.3% | 0.3% | 0.3% | 0.3% | 0.3% | 0.3% | 0.3% |
| Hydrogen peroxide | 8.5% | 8.5% | 8.5% | 8.5% | 8.5% | 8.5% | 8.5% | 8.5% | 8.5% | 8.5% |

TABLE 6-continued

| Composition [wt %] | FE-22 | FE-23 | FE-24 | FE-25 | FE-26 | FE-27 | FE-28 | FE-29 | FE-30 | FE-31 |
|---|---|---|---|---|---|---|---|---|---|---|
| Acetic acid | 69.6% | 69.6% | 69.6% | 69.6% | 69.6% | 69.6% | 69.6% | 69.6% | 69.6% | 69.6% |
| Takesurf A-47Q | 0.01% | 0.01% | 0.01% | 0.01% | 0.01% | 0.01% | 0.01% | 0.01% | 0.01% | 0.01% |
| APDA | 0.01% | 0.01% | 0.01% | 0.01% | 0.01% | 0.01% | 0.01% | 0.01% | 0.01% | 0.01% |
| Additive | 0.25% | 0.25% | 0.25% | 0.25% | 0.25% | 0.25% | 0.25% | 0.1% | 0.04% | 0.01% |
|  | PVA | IA | MLA | OA | SA | MA | BA | BA | BA | BA |
| Water | 21.33% | 21.33% | 21.33% | 21.33% | 21.33% | 21.33% | 21.33% | 21.48% | 21.54% | 21.57% |
| Total | 100% | 100% | 100% | 100% | 100% | 100% | 100% | 100% | 100% | 100% |
| Test results |  |  |  |  |  |  |  |  |  |  |
| SiGe25 ER (Å/min) | 100.0 | 129.0 | 113.4 | 114.5 | 109.1 | 113.0 | 0.1 | 72.5 | 98.4 | 95.5 |
| SiOx ER (Å/min) | 26.0 | 31.7 | 26.5 | 26.9 | 27.0 | 27.2 | 0.8 | 18.3 | 26.4 | 24.9 |

PVA = Polyvinyl alcohol
IA = Iminidiacetic acid
MLA = Malonic acid
OA = Oxalic acid
SA = Succinic acid
MA = Malic acid
BA=Boric acid As shown in Table 6, formulations FE-22 to FE-31 contained different additives. The results showed that formulations FE-22 to FE-27 and FE-29 to FE-31 exhibited relatively high SiGe25 etch rates and relatively low SiOx etch rates. In particular, the results for formulations FE-28 to FE-31 show that as the amount of boric acid increased from 0.01% to 025%, both the SiGe25 etch rate and the SiOx etch rate decreased. Formulation FE-28 exhibited both low SiGe25 etch rate and low SiOx etch rate, which is believed to be due to the presence of a large amount (i.e., 0.25%) of boric acid.

Example 6

Formulation Examples 32-37 (FE-32 to FE-37) were prepared according to General Procedure 1, and evaluated according to General Procedures 2 and 3A. The formulations and the test results are summarized in Table 7.

TABLE 7

| Composition [wt %] | FE-32 | FE-33 | FE-34 | FE-35 | FE-36 | FE-37 |
|---|---|---|---|---|---|---|
| Hydrofluoric acid | 0.3% | 0.3% | 0.3% | 0.3% | 0.3% | 0.2% |
| Hydrogen peroxide | 8.5% | 8.5% | 8.5% | 8.5% | 8.5% | 8.5% |
| Acetic acid | 69.84% | 69.84% | 69.84% | 09.84% | 45% | 45% |
| Takesurf A-47Q | 0.01% | 0.01% | 0.01% | 0.01% | 0.01% | 0.01% |
| APDA | 0.01% | 0.01% | 0.01% | 0.01% | 0.01% | 0.01% |
| Organic Solvent | None | None | None | None | 24.91% PG | None |
| Additive | 0.05% | 0.1% | 0.05% | 0.1% | 0.05% | 0.025% |
|  | PBA | PBA | NBA | NBA | PBA | NBA |
| Water | 21.29% | 21.24% | 21.29% | 21.24% | 21.22% | 46.23% |
| Total | 100% | 100% | 100% | 100% | 100% | 100% |
| Test results |  |  |  |  |  |  |
| SiGe25 ER (Å/min) | 124.3 | 106.5 | 145.9 | 142.9 | 91.3 | 93.5 |
| SiNx ER (Å/min) | N/A | 0 | N/A | 0 | 0 | 0 |
| Poly-Si ER (Å/min) | N/A | 3.0 | N/A | 6.9 | 2.7 | 7.1 |
| SiCO ER (Å/min) | N/A | 1.0 | N/A | 0.7 | 1.0 | 1.0 |
| SiOx ER (Å/min) | 26.0 | 31.7 | 26.5 | 26.9 | 12.4 | 22.7 |

PBA = Phenyl boronic acid
NBA = Naphthalene-1-boronic acid

As shown in Table 7, formulations FE-32 to FE-37 contained either phenyl boronic acid or naphthalene-1-boronic acid as an additive. The results showed that all formulations exhibited relatively high SiGe25/SiNx, SiGe25/poly-Si, and SiGe25/SiCo etch selectivity. The also exhibited relatively low SiOx etch rates.

Example 7

Comparative Formulation Examples 9-12 (CFE-9 to CFE-12) were prepared according to General Procedure 1, and evaluated according to General Procedures 2 and 3A. The formulations and the test results are summarized in Table 8.

TABLE 8

| Composition [wt %] | CFE-9 | CFE-10 | CFE-11 | CFE-12 |
|---|---|---|---|---|
| Hydrofluoric acid | 0.1% | 0.038% | 0.05% | 0.1% |
| Hydrogen peroxide | None | None | None | None |
| Acetic acid | None | None | None | None |
| Nitric acid | 43.08% | 43.08% | 43% | 43% |
| Takesurf A-47Q | 0.02% | None | 0.02% | 0.02% |
| APDA | 0.02% | None | 0.02% | 0.02% |
| Organic Solvent | None | None | None | 20% PG |
| Water | 56.78% | 56.88% | 56.91% | 36.86% |
| Total | 100% | 100% | 100% | 100% |
| Test results |  |  |  |  |
| SiGe25 ER (Å/min) | 64.1 | 54.5 | 115.6 | 30.0 |
| SiNx ER (Å/mm) | 0.8 | 2.7 | 0.4 | 0.9 |
| Poly-Si ER (Å/min) | 11.5 | 3.0 | 5.4 | 1.1 |
| SiCO ER (Å/min) | 0 | 1.5 | 0 | 0.5 |
| SiOx ER (Å/mm) | 76.0 | 16.3 | 49.9 | 48.7 |

As shown in Table 8, formulations CFE-9 to CFE-12 contained no hydrogen hydroxide and no acetic acid. The results showed that formulations CFE-9, CFE-11, and CFE-12 exhibited relatively high SiOx etch rates. Although formulation CFE-10 exhibited relatively low SiOx etch rates, it also had relatively low etch rate for removing SiGe, a target material to be removed by the etching compositions described in the present disclosure.

Example 8

Formulation Examples 38-44 (FE-38 to FE-44) were prepared according to General Procedure 1, and evaluated according to General Procedures 2 and 3A. The formulations and the test results are summarized in Table 9.

TABLE 9

| Composition [wt %] | FE-38 | FE-39 | FE-40 | FE-41 | FE-42 | FE-43 | FE-44 |
|---|---|---|---|---|---|---|---|
| Hydrofluoric acid | 0.3% | 0.3% | 0.3% | 0.3% | 0.3% | 0.3% | 0.3% |
| Hydrogen peroxide | 8.5% | 8.5% | 8.5% | 8.5% | 8.5% | 8.5% | 8.5% |
| Acetic acid | 25.79% | None | 35% | 81.15% | 56.22% | 56.22% | 76.15% |
| Acetic anhydride | 55.52% | 55.6% | 36.28% | None | None | None | None |
| Takesurf A-47Q | 0.01% | 0.01% | 0.01% | 0.01% | 0.01% | 0.01% | 0.01% |
| APDA | 0.01% | 0.01% | 0.01% | 0.01% | 0.01% | 0.01% | 0.01% |
| Organic Solvent | None | 25.79% PG | 10% PG | None | 25% PG | 20% PG | None |
| Water | 9.87% | 9.79% | 9.9% | 10.03% | 9.96% | 14.96% | 15.03% |
| Total | 100% | 100% | 100% | 100% | 100% | 100% | 100% |
| Test results | | | | | | | |
| SiGe25 ER (Å/min) | 105.4 | 40.5 | 95.8 | N/A | 654 | 75.1 | 130.4 |
| SiNx ER (Å/min) | 1.7 | 0.5 | 1.3 | N/A | N/A | N/A | N/A |
| Poly-Si ER (Å/min) | 3.8 | 1.1 | 3.9 | N/A | N/A | N/A | N/A |
| SiCO ER (Å/min) | 1.2 | 1.1 | 1.8 | N/A | N/A | N/A | N/A |
| SiOx ER (Å/mm) | 13.2 | 4.6 | 10.6 | N/A | 11.2 | 15.9 | 23.8 |

3.0 Formulations FE-38, FE-40, and FE-41 contained yellow/brown precipitate, which is believed to be Takesurf A-47Q precipitated from the solution due to the presence of a relatively small amount of water and organic solvent in the formulations. On the other hand, the other four formulations did not contain any precipitate, indicating that all solutes were dissolved in these formulations.

As shown in Table 9, all of these formulations (except for FE-42 whose data were not measure) exhibited relatively low SiOx etch rates. In addition, formulations FE-38 to FE-40 exhibited relatively high SiGe/SiNx, SiGe/poly-Si, and SiGe/SiCO etch selectivity.

Example 9

Formulation Examples 45-52 (FE-45 to FE-52) were prepared according to General Procedure 1 and evaluated according to General Procedures 2 and 3A. The formulations and the test results are summarized in Table 10.

TABLE 10

| Composition [wt %] | FE-45 | FE-46 | FE-47 | FE-48 | FE-49 | FE-50 | FE-51 | FE-52 |
|---|---|---|---|---|---|---|---|---|
| Hydrofluoric acid | 0.3% | 0.3% | 0.3% | 0.3% | 0.3% | 0.3% | 0.3% | 0.3% |
| Hydrogen peroxide | 8.5% | 8.5% | 8.5% | 8.5% | 8.5% | 8.5% | 8.5% | 8.5% |
| Acetic anhydride | 70.06% | 70.06% | 70.06% | 70.06% | 70.06% | 70.06% | 65.01% | 65.01% |
| Takesurf A-47Q | 0.01% | 0.01% | 0.01% | 0.01% | 0.01% | 0.01% | 0.01% | 0.01% |
| APDA | 0.01% | 0.01% | 0.01% | 0.01% | 0.01% | 0.01% | 0.01% | 0.01% |
| Organic Solvent | None | None | None | None | None | None | 5% MMB | 5% MMB |
| Additive | 0.01% PBA | 0.02% PBA | 0.04% PBA | 0.06% PBA | 0.075% PBA | 0.1% PBA | 0.05% PBA | 0.1% PBA |
| Water | 21.11% | 21.1% | 21.08% | 21.06% | 21.045% | 21.02% | 21.12% | 21.07% |
| Total | 100% | 100% | 100% | 100% | 100% | 100% | 100% | 100% |
| Test results | | | | | | | | |
| SiGe25 ER (Å/min) | N/A | N/A | N/A | N/A | N/A | 117.2 | N/A | 109.9 |
| SiGe20 ER (Å/min) | 153.1 | 159.0 | 151.1 | 147.0 | 145.4 | 154.4 | 139.2 | 124.4 |
| SiNx ER (Å/min) | N/A | N/A | N/A | N/A | 3.2 | 0.8 | 0.6 | |
| Poly-Si ER (Å/min) | N/A | N/A | N/A | N/A | 4.8 | N/A | 5.5 | |

TABLE 10-continued

| Composition [wt %] | FE-45 | FE-46 | FE-47 | FE-48 | FE-49 | FE-50 | FE-51 | FE-52 |
|---|---|---|---|---|---|---|---|---|
| SiCO ER (Å/min) | N/A | NIA | N/A | N/A | N/A | 1.3 | N/A | 0.8 |
| SiOx ER (Å/min) | 17.6 | 18.4 | 16.0 | 14.2 | 14.5 | 10.6 | 15.2 | 11.7 |

SiGe20 = a SiGe film containing 20 wt % Ge

As shown in Table 10, formulations FE-45 to FE-52 contained acetic anhydride instead of acetic acid and contained phenyl boronic acid (PBA) as an additive. The results showed that all formulations exhibited relatively high SiGe etch rates and relatively low SiOx etch rates. In addition, formulations FE-50 and FE-52 exhibited relatively high SiGe/SiNx, SiGe/poly-Si, and SiGe/SiCO etch selectivity.

While the invention has been described in detail with reference to certain embodiments thereof, it will be understood that modifications and variations are within the spirit and scope of that which is described and claimed.

What is claimed is:

1. An etching composition, comprises:
   at least one fluorine-containing acid, the at least one fluorine-containing acid comprising hydrofluoric acid and being in an amount of at most about 0.5 wt % of the composition;
   at least one oxidizing agent in an amount of from about 5 wt % to about 10 wt % of the composition;
   at least one organic acid or an anhydride thereof, the at least one organic acid comprising formic acid, acetic acid, propionic acid, or butyric acid and being in an amount of from about 50 wt % to about 80 wt % of the composition;
   at least one polymerized naphthalene sulfonic acid in an amount of from about 0.005 wt % to about 0.1 wt % of the composition;
   at least one amine, the at least one amine comprising an amine of formula (I): $N-R_1R_2R_3$, wherein $R_1$ is $C_1-C_8$alkyl optionally substituted by OH or $NH_2$, $R_2$ is H or $C_1-C_8$alkyl optionally substituted by OH, and $R_3$ is $C_1-C_8$alkyl optionally substituted by OH and the at least one amine being in an amount of from about 0.001 wt % to about 0.1 wt % of the composition; and
   water.

2. The composition of claim 1, wherein the at least one oxidizing agent comprises hydrogen peroxide.

3. The composition of claim 1, wherein the at least one oxidizing agent is from about 6 wt % to about 10 wt % of the composition.

4. The composition of claim 1, wherein the at least one organic acid or an anhydride thereof comprises acetic acid and acetic anhydride.

5. The composition of claim 4, wherein the total amount of the acetic acid and acetic anhydride is from about 60 wt % to about 80 wt % of the composition.

6. The composition of claim 1, wherein the at least one polymerized naphthalene sulfonic acid comprises a sulfonic acid having a structure of

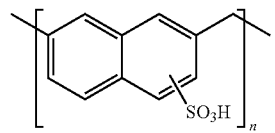

in which n is 3 to 6.

7. The composition of claim 1, wherein the at least one polymerized naphthalene sulfonic acid is from about 0.005 wt % to about 0.05 wt % of the composition.

8. The composition of claim 1, wherein the amine of formula (I) is diisopropylamine, N-butyl diethanolamine, N-(3-aminopropyl)-diethanolamine, N-octylglucamine, N-ethylglucamine, N-methylglucamine, or 1-[bis(2-hydroxyethyl)amino]-2-propanol.

9. The composition of claim 1, wherein the at least one amine is from about 0.005 wt % to about 0.05 wt % of the composition.

10. The composition of claim 1, further comprising an inorganic acid.

* * * * *